United States Patent
Romero et al.

(10) Patent No.: US 8,030,763 B2
(45) Date of Patent: Oct. 4, 2011

(54) SEMICONDUCTOR PACKAGE WITH REDUCED INDUCTIVE COUPLING BETWEEN ADJACENT BONDWIRE ARRAYS

(75) Inventors: Manuel F. Romero, Chandler, AZ (US); Peter H. Aaen, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 763 days.

(21) Appl. No.: 12/147,313

(22) Filed: Jun. 26, 2008

(65) Prior Publication Data
US 2009/0322430 A1    Dec. 31, 2009

(51) Int. Cl.
*H01L 23/52* (2006.01)
*H03F 3/60* (2006.01)

(52) U.S. Cl. ........ 257/723; 257/724; 257/773; 257/776; 257/784; 257/786; 257/E23.01; 257/E23.141; 330/169; 330/170; 330/286

(58) Field of Classification Search ................. 257/723, 257/724, 773, 776, 784, 786, E23.01, E23.141; 330/169, 170, 286
See application file for complete search history.

(56) References Cited

U.S. PATENT DOCUMENTS

| | | | |
|---|---|---|---|
| 4,686,492 A * | 8/1987 | Grellmann et al. | 333/33 |
| 5,004,317 A | 4/1991 | Jackson et al. | |
| 7,061,329 B2 * | 6/2006 | Inoue et al. | 330/302 |
| 7,295,074 B2 | 11/2007 | Wong et al. | |
| 2005/0087856 A1 | 4/2005 | Joiner et al. | |
| 2007/0235855 A1 | 10/2007 | Bokatius et al. | |

* cited by examiner

*Primary Examiner* — Eugene Lee
*Assistant Examiner* — Peniel M Gumedzoe
(74) *Attorney, Agent, or Firm* — Meschkow & Gresham, P.L.C.

(57) ABSTRACT

A semiconductor package (20) includes circuits (22, 24). The circuit (22) includes electrical devices (52, 54) interconnected by a bondwire array (62). Likewise, the circuit (24) includes electrical devices (58, 60) interconnected by a bondwire array (64). Signal wires (76) of the bondwire array (62) are proximate to signal wires (78) of the bondwire array (64). Ground wires (66, 68) are located on either side of, and close to, bondwire array (62). Ground wires (70, 72) are located on either side of, and close to, bondwire array (64). The ground wires (66, 68, 70,72) are electrically coupled to a ground region (74). The ground wires (66, 68, 70, 72) reduce a magnetic flux density (140) via induced return currents (126, 130) on the ground wires of opposite polarity to signal currents (124, 128) on the bondwire arrays (62, 64) to reduce inductive coupling between the adjacent bondwire arrays (62, 64).

20 Claims, 4 Drawing Sheets

SEMICONDUCTOR PACKAGE WITH REDUCED INDUCTIVE COUPLING BETWEEN ADJACENT BONDWIRE ARRAYS

TECHNICAL FIELD OF THE INVENTION

The present invention relates generally to semiconductor packages. More specifically, the present invention relates to a semiconductor package with reduced inductive coupling between adjacent bondwire arrays.

BACKGROUND OF THE INVENTION

Wireless communication systems often employ power amplifiers for increasing the power of a signal. In a wireless communication system, a power amplifier is usually designated as the last amplifier in a transmission chain (the output stage) and it is the amplifier stage that typically requires the most attention to power efficiency. Indeed, the performance of a transceiver in a wireless communication system depends primarily on the performance of the power amplifier. High gain, high linearity, stability, and a high level of power-added efficiency (i.e., ratio of the difference between the output power and the input power to DC power) are characteristics of an ideal amplifier.

In general, a power amplifier operates at maximum power efficiency when the power amplifier transmits peak output power. However, power efficiency worsens as output power decreases. Recently, the Doherty power amplifier technique has been the focus of attention not only for base stations but also for mobile terminals because of its high power-added efficiency.

A Doherty power amplifier typically includes two or more amplifiers, for example, a "carrier amplifier" and a "peaking amplifier." The amplifiers are connected in parallel with their outputs joined by an offset transmission line, which performs impedance transformation. The peaking amplifier delivers current as the carrier amplifier saturates, thereby reducing the impedence seen at the output of the carrier amplifier. Thus, the carrier amplifier delivers more current to the load while it is saturated because of a "load-pulling" effect. Since the carrier amplifier remains close to saturation, a Doherty power amplifier is able to transmit peak output power so that the total efficiency of the system remains high.

The high efficiency of the Doherty architecture makes it desirable for current and next-generation wireless systems. However, it presents unique challenges in terms of semiconductor package design. Current Doherty power amplifier semiconductor package design calls for the utilization of discrete devices and integrated circuits, for example, one that forms the carrier amplifier and another that forms the peaking amplifier. These discrete devices are maintained a distance apart in order to limit problems with crosstalk that can occur between the carrier and peaking amplifiers. One source of crosstalk in the semiconductor package architecture is between arrays of signal wires, referred to herein as bondwire arrays, that may be utilized between electrical devices in each of the carrier and peaking amplifiers. That is, the performance of a Doherty power amplifier can be adversely perturbed by coupling (i.e., the transfer of energy from one circuit component to another through a shared magnetic or electric field) between adjacent bondwire arrays of the corresponding components of the Doherty power amplifier. Coupling can be of two types, electric (commonly referred to as capacitive coupling) and magnetic (used synonymously with inductive coupling). Inductive or magnetic coupling occurs when a varying magnetic field exists between current carrying parallel conductors that are in close proximity to one another, thus inducing a voltage across the receiving conductor.

Unfortunately, maintaining spatial distance between amplifiers, for example, the carrier and peaking amplifiers of a Doherty power amplifier, to control crosstalk caused by inductive coupling limits the miniaturization of the semiconductor package. Limiting the miniaturization of such devices is undesirable where low cost, a low weight, and a small volume are essential for application.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

An embodiment entails a high power Doherty amplifier semiconductor package with compact design. In particular, techniques are employed for reducing inductive coupling so that the carrier and peaking amplifiers of a Doherty power amplifier may be implemented in a single package, referred to herein as a dual-path semiconductor package. This enables the use of a Doherty power amplifier semiconductor package in base station power amplifiers, cell phones, blue tooth devices, and other devices dependent upon semiconductor packages, where low cost, low weight, and small volume are essential for application. An embodiment described herein reduces inductive coupling between bondwire arrays in a Doherty power amplifier. However, it will become apparent that the techniques described below for reducing inductive coupling may be implemented in a variety of semiconductor device designs.

Figure 1:
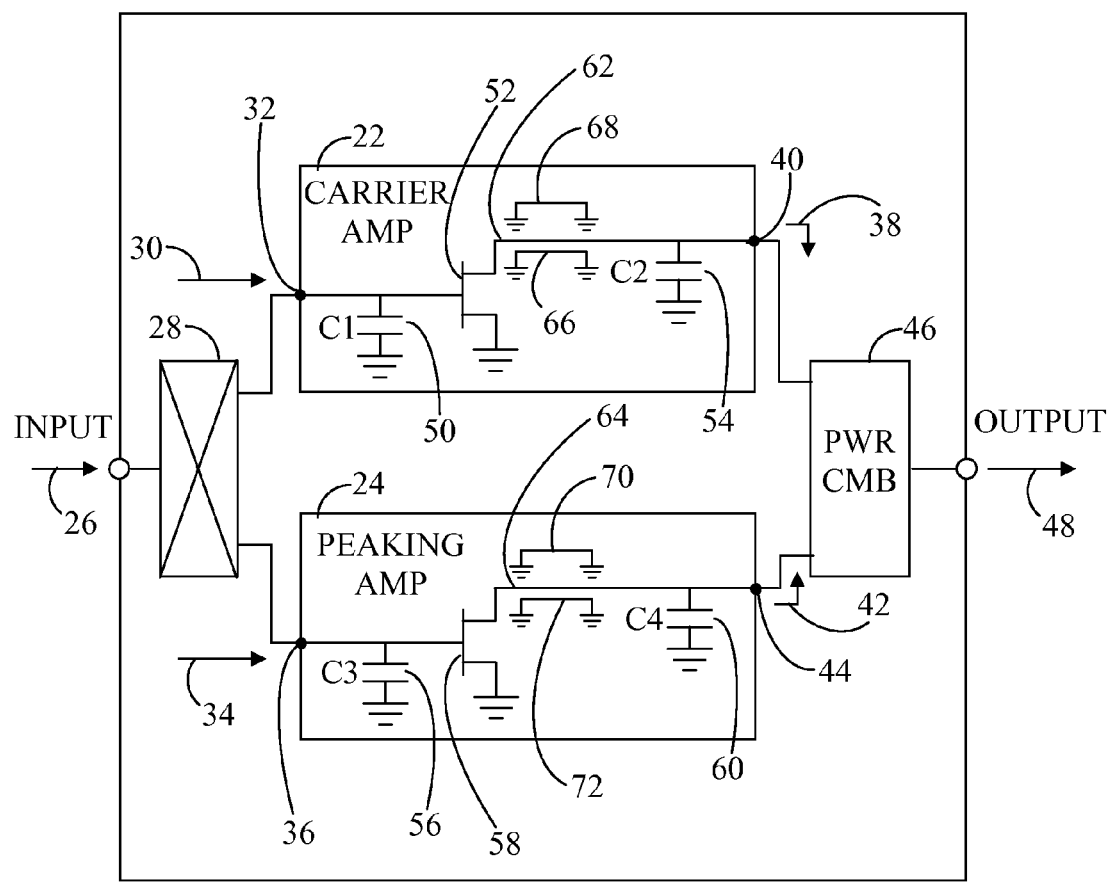
FIG. 1 shows a block diagram of a Doherty power amplifier semiconductor package.

FIG. 1 shows a block diagram of a Doherty power amplifier semiconductor package 20. Doherty power amplifier semiconductor package 20 includes a carrier amplifier circuit 22 and a peaking amplifier circuit 24 connected in parallel. An input signal 26 is split into two signals by an input splitter 28. One of the resulting input signals 30 is communicated to an input 32 of carrier amplifier circuit 22, and another input signal 34 is communicated to an input 36 of peaking amplifier circuit 24. An output signal 38 is communicated from an output 40 of carrier amplifier circuit 22. Likewise, an output signal 42 is communicated from an output 44 of peaking amplifier circuit 22. Output signal 38 is power combined with output signal 42 through a power combiner 46 to produce a combined output signal 48. Those skilled in the art will recognize that Doherty power amplifier semiconductor package typically includes additional electronic devices and circuitry not shown herein for simplicity of illustration.

In one embodiment, carrier amplifier circuit 22 is configured to be on for an entire range of output powers of Doherty power amplifier semiconductor package 20. Peaking amplifier circuit 24 is configured to turn on only when carrier amplifier circuit 22 saturates. Power combiner (PWR CMB) 46, operating to combine output signal 38 from carrier amplifier circuit 22 with output signal 42 from peaking amplifier circuit 24 may be a quarter-wave impedance inverter. The quarter-wave impedance inverter can add a ninety degree lag to output signal 38 (e.g., current) from carrier amplifier circuit 22. The phase of peaking amplifier circuit 24 is typically designed to lag carrier amplifier circuit 22 by ninety degrees so that the two output signals 38 and 42 (e.g., currents) add in phase when output signals 38 and 42 are combined at the output of power combiner 46 to form combined output signal 48.

In the exemplary embodiment shown, each of carrier amplifier circuit 22 and peaking amplifier circuit 24 may include a number of active and passive electrical devices. For example, carrier amplifier circuit 22 includes a capacitor 50, labeled C1, coupled to input 32 which receives input signal 30. An output of capacitor 50 is coupled to an input of a transistor 52 which applies the appropriate amplification to input signal 30. An output of transistor 52 is coupled to an input of another capacitor 54, labeled C2. Capacitors 50 and 54 function to properly condition input signal 30 prior to and immediately after amplification at transistor 52. Likewise, peaking amplifier circuit 24 includes a capacitor 56, labeled C3, coupled to input 36 which receives input signal 34. An output of capacitor 56 is coupled to an input of a transistor 58 which applies the appropriate amplification to input signal 34. An output of transistor 58 is coupled to an input of another capacitor 60, labeled C4. Like capacitors 50 and 54, capacitors 56 and 60 function to properly condition input signal 34 prior to an immediately after amplification at transistor 58. Those skilled in the art will recognize that carrier amplifier circuit 22 and peaking amplifier circuit 24 may include additional electronic devices not shown herein for simplicity of illustration.

In semiconductor package design for Doherty power amplifier semiconductor package 20, the electrical devices may be connected using multiple parallel signal wires, known as "bondwire arrays." In a practical application, one or more of the signal paths of carrier amplifier circuit 22, for example, between input 32 and capacitor 50, between capacitor 50 and transistor 52, between transistor 52 and capacitor 54, and between capacitor 54 and output 40 may be realized as bondwire arrays. Likewise, one or more of the signal paths of peaking amplifier circuit 24, for example, between input 36 and capacitor 56, between capacitor 56 and transistor 58, between transistor 58 and capacitor 60, and between capacitor 60 and output 44 may be realized as bondwire arrays.

In a dual-path semiconductor package design for Doherty power amplifier semiconductor package 20, these various bondwire arrays may be placed in very close proximity to one another due to their packaging into a single housing. The small distances between the signal paths of the bondwire arrays leads to high levels of inductive coupling between adjacent bondwire arrays. In this embodiment, ground wires are introduced on either side of those bondwire arrays that have the highest inductive coupling in order to provide isolation between the adjacent signal paths. As represented in FIG. 1, a bondwire array 62 interconnects transistor 52 and capacitor 54 and a bondwire array 64 interconnects transistor 58 and capacitor 60. Ground wires 66 and 68 are positioned on either side of bondwire array 62. Likewise, ground wires 70 and 72 are positioned on either side of bondwire array 64. Ground wires 66, 68, 70, and 72 are placed within close proximity to their respective bondwire arrays 62, 64 to reduce inductive coupling between bondwire arrays 62 and 64. By placing two ground wires per bondwire array, a magnetic flux vector can be reduced via induced return currents on the ground wires, thereby reducing inductive coupling (discussed in greater detail below).

The term "ground wire" as used herein refers to a wire that is coupled to a ground node or ground plane at one or more of its ends. The term "signal wire" refers to a wire that carries some form of electrical signal between electrical devices. Hence, "bondwire array" refers to a group of signal wires that carry electrical signals between electrical devices. In the illustrated embodiment, for example, the signal wires and bondwire arrays carry high-frequency signals such as microwave signals.

Ground wires 66, 68, 70, and 72 are positioned on either side of respective bondwire arrays 62 and 64 because bondwire arrays 62 and 64 are likely to carry the highest current in Doherty power amplifier semiconductor package 20. As such, bondwire arrays 62 and 64 may exhibit greater inductive coupling than other bondwire arrays that may be present in Doherty power amplifier semiconductor package 20. However, it should be understood that additional ground wires may be added to isolate any two adjacent signal carrying bondwire arrays in Doherty power amplifier semiconductor package 20. In addition, the isolation of adjacent bondwire arrays need not be limited to a dual-path Doherty power amplifier semiconductor package, but may be applied to any of a number of products where isolation between adjacent bondwire arrays is essential.

Figure 2:
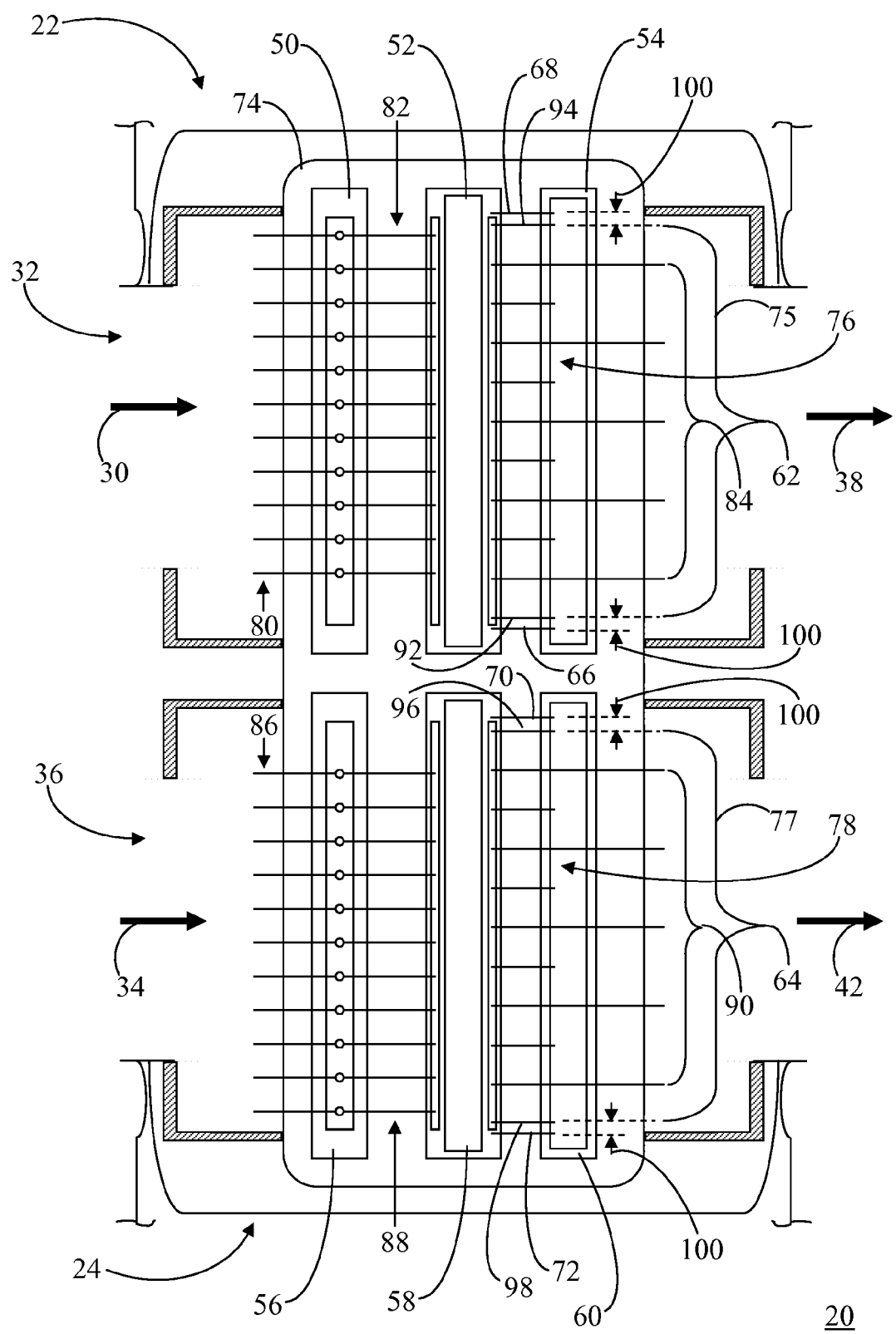
FIG. 2 shows a top schematic view of carrier and peaking amplifier circuits of the Doherty power amplifier semiconductor package of FIG. 1.

FIG. 2 shows a top schematic view of carrier and peaking amplifiers circuits 22 and 24 of Doherty power amplifier semiconductor package 20 configured in a dual-path semiconductor package. As shown, capacitors 50, 54, 56, and 60 as well as transistors 52 and 58 are semiconductor devices manufactured and subsequently mounted to the surface of a common (i.e., single) carrier, such as a package ground plane 74. Capacitors 50, 54, 56, and 60 may be, for example, Metal-Oxide-Semiconductor (MOS) capacitors mounted on ground plane 74. A bracket 75 is used to demarcate signal wires 76 of bondwire array 62 interconnecting transistor 52 with capacitor 54. Similarly, a bracket 77 is used to demarcate signal wires 78 of bondwire array 64 interconnecting transistor 58 with capacitor 60.

It should be noted that Doherty power amplifier semiconductor package 20 can include additional bondwire arrays. For example, a bondwire array 80 interconnects input 32 of carrier amplifier circuit 22 with capacitor 50. Another bondwire array 82 interconnects capacitor 50 with an input of transistor 52, and yet another bondwire array 84 (with longer signal wires than signal wires 76 of bondwire array 62) bypasses capacitor 54 to interconnect transistor 52 with additional electrical devices, not shown for simplicity of illustration. Similarly, a bondwire array 86 interconnects input 36 of peaking amplifier circuit 24 with capacitor 56. Another bondwire array 88 interconnects capacitor 56 with an input of transistor 58, and yet another bondwire array 90 (with longer signal wires than signal wires 78 of bondwire array 64) bypasses capacitor 60 to interconnect transistor 58 with additional electrical devices, again not shown for simplicity of illustration.

In the illustrated embodiment, the symmetrical layout of carrier and peaking amplifier circuits 22 and 24 results in the corresponding components of carrier amplifier circuit 22 being adjacent to corresponding components of peaking amplifier circuit 24. Accordingly, the arrangement of signal wires 76 of bondwire array 62 of carrier amplifier circuit 22 are adjacent to and geometrically parallel with the parallel signal wires 78 of bondwire array 64 of peaking amplifier circuit 24. In another embodiment, bondwire arrays 62 and 64 need not be geometrically parallel, but may instead be offset and/or angled relative to one another.

An inner signal wire 92 of bondwire array 62 lies closer to bondwire array 64 than the remaining signal wires 76 of bondwire array 62. In addition, an outer signal wire 94 lies farther away from bondwire array 64 than the remaining signal wires 76 of bondwire array 62. Likewise, an inner signal wire 96 of bondwire array 64 lies closer to bondwire array 62 than remaining signal wires 78 of bondwire array 64, and an outer signal wire 98 lies farther away from bondwire array 62 than the remaining signal wires 78 of bondwire array 64.

Ground wire 66 is positioned parallel with and proximate to inner signal wire 92 and ground wire 68 is positioned parallel with and proximate to outer signal wire 94 of bondwire array 62. Ground wire 70 is positioned parallel with and proximate to inner signal wire 96 and ground wire 72 is positioned parallel with and proximate to outer signal wire 98 of bondwire array 64. Thus, at least one ground wire, and in this particular configuration two ground wires 66 and 70, is located between bondwire arrays 62 and 64.

Each of ground wires 66, 68, 70, and 72 are spaced apart from their respective signal wires 92, 94, 96, and 98 by a distance 100. Distance 100 is desirably in a range between fifty and five hundred microns (i.e., approximately between 2 and 20 mil). It is desirable to minimize distance 100 in order to achieve an optimal reduction in inductive coupling between corresponding signal arrays 62 and 64, while still maintaining enough space to prevent shorting between ground wires 66, 68, 70, and 72 and their respective signal wires 92, 94, 96, and 98.

Figure 3:
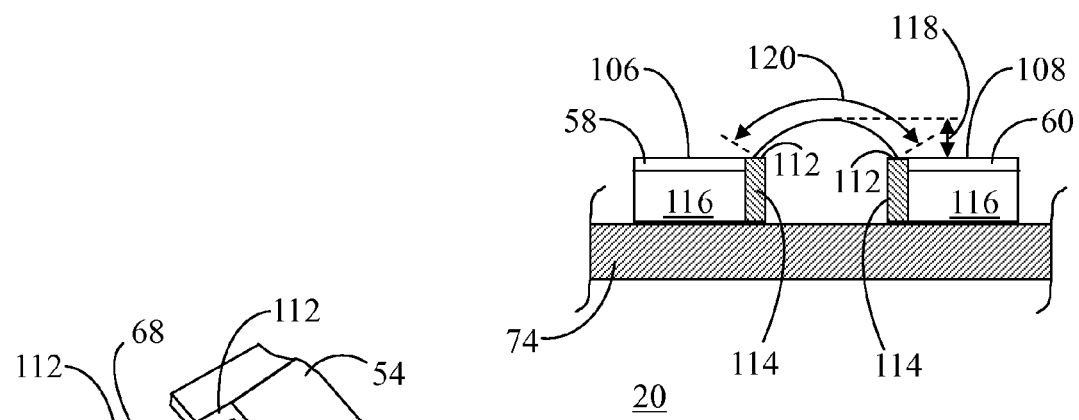
FIG. 3 shows a side view of a portion of the Doherty power amplifier semiconductor package.
Figure 4:
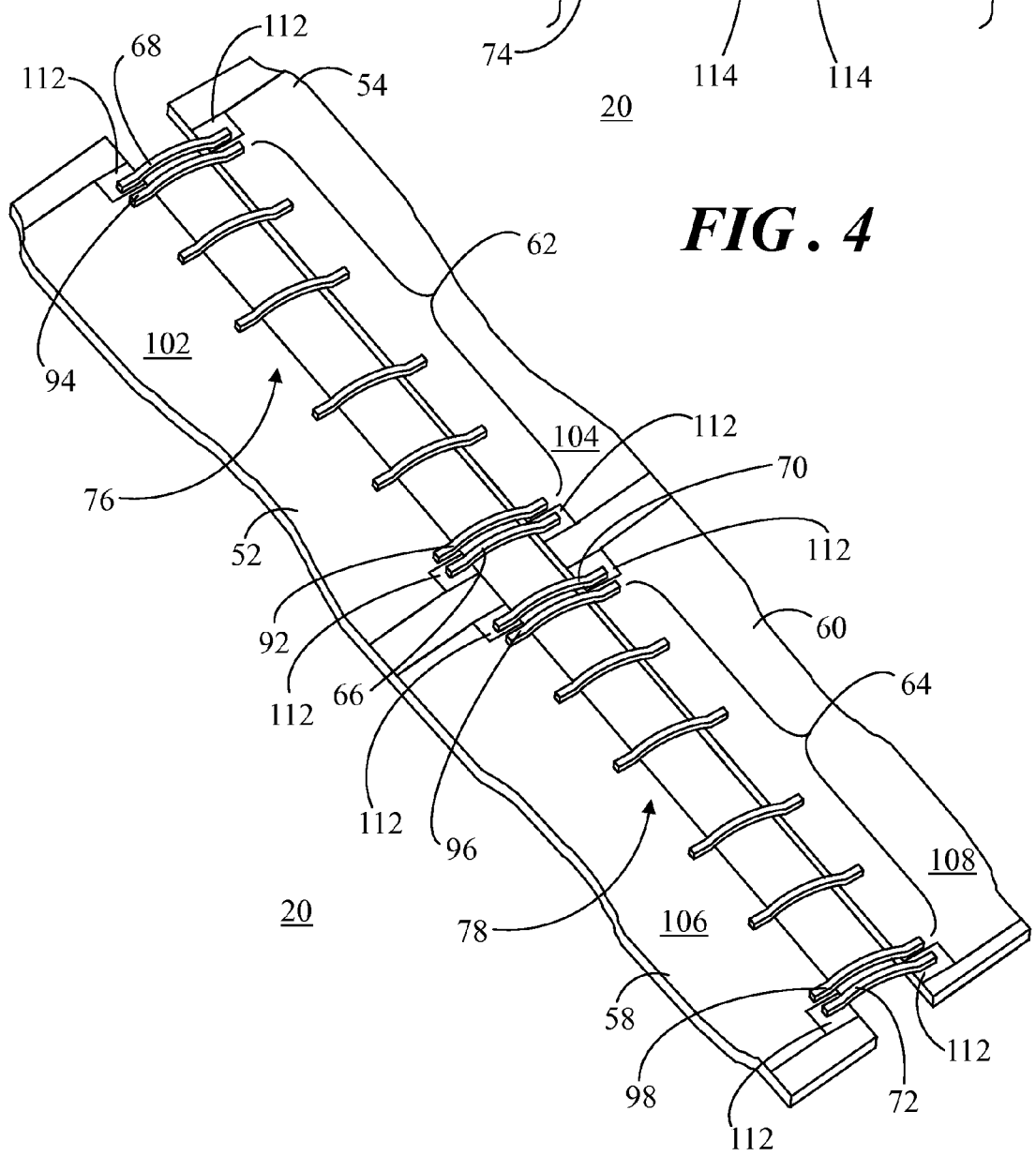
FIG. 4 shows a perspective view of a portion of the Doherty power amplifier semiconductor package.

Referring now to FIGS. 3-4, FIG. 3 shows a side view of a portion of Doherty power amplifier semiconductor package 20 and FIG. 4 shows a perspective view of a portion of the Doherty power amplifier semiconductor package 20. In the perspective view of FIG. 4, the signal wires of bondwire arrays 84 and 90 (FIG. 2) have been removed to more clearly visualize signal wires 76 and 78 of bondwire arrays 62 and 64.

In this embodiment, one end of each of the signal wires 76 of bondwire array 62 and each of ground wires 66 and 68 is attached to a topside 102 of transistor 52, and an opposing end of each of the signal wires 76 of bondwire array 62 and each of ground wires 66 and 68 is attached to a topside 104 of capacitor 54. In addition, one end of each of the signal wires 78 of bondwire array 64 and each of ground wires 70 and 72 is attached to a topside 106 of transistor 58, and an opposing end of each of the signal wires 78 of bondwire array 64 and each of ground wires 70 and 72 is attached to a topside 108 of capacitor 60. The ends of signals wires 76 and 78, as well as ground wires 66, 68, 70, and 72, may be connected to bonding areas on the respective electrical devices, i.e., transistors 52, 58 and capacitors 54, 60) in any convenient manner (e.g., via ultrasonic, thermosonic, or any other conventional bonding method). Such wire bonding techniques are well known in the art and thus need not be described herein.

Each of ground wires 66, 68, 70, and 72 is electrically connected to ground plane 74. The ground plane is referred to hereinafter as ground region 74. In one example, topsides 102, 104, 106, and 108 include a ground interconnect 112 to which opposing ends of each of ground wires 66, 68, 70, and 72 is attached. In another example, ground wires 66, 68, 70, and 72 may be connected directly to the package ground plane, i.e., ground region 74, near each end of respective signal wires 76 and 78, and have a substantially similar profile (discussed below) to signal wires 76 and 78. Ground interconnect 112 may be electrically connected to ground region 74 via a conductive connection path 114. Conductive connection path 114 may be any conductive element formed, deposited, or otherwise provided between ground interconnect 112 and ground region 74. Conductive connection path 114 might include, for example, vias to ground plane 74 provided within an isolator 116, wrap-around metallization, or other techniques known in the art. Alternatively, ground interconnect 112 may be coupled to an external ground region (e.g., a circuit board ground plane) via leads, wires, or the like. In such a case, conductive connector path 114 leading to ground region 74 is optional. It should be noted that ground wires 66, 68, 70, and 72 need not be connected to ground region 74 at both ends. Alternatively, only one end of each of ground wires 66, 68, 70, and 72 need be connected to ground region 74.

In accordance with one embodiment, signal wires 76 and 78 of each of bondwire arrays 62 and 64 exhibit substantially the same profile. In addition, ground wires 66, 68, 70, and 72 also exhibit this same profile. The term "profile" used herein refers to the shape of a particular wire in terms of a loop height 118 and a wire length 120. The term "profile" additionally refers to signal wires 76 and 78 and ground wires 66, 68, 70, and 72 tracing generally the same path in two dimensional space relative to one another. That is, as shown in FIGS. 3 and 4, loop height 118 and wire length 120 for each of signal wires 76 and 78, and for each of ground wires 66, 68, 70, and 72 is substantially the same. A further reduction in inductive coupling can be achieved by having this common wire profile for both signal wires 76 and 78 of bondwire arrays 62 and 64 and for ground wires 66, 68, 70, and 72.

The illustrated embodiment describes each of signal wires 76 and 78 and ground wires 66, 68, 70, and 72 exhibiting a common profile. It should be appreciated, however, that only those ground wires associated with a particular bondwire array should share a common profile with the associated bondwire array. That is, signal wires 76 of bondwire array 62 with ground wires 66 and 68 should exhibit a common profile, and signal wires 78 of bondwire array 64 with ground wires 70 and 72 should exhibit a common profile. However, the profile of signal wires 76 and ground wires 66 and 68 need not be identical to the profile of signal wires 78 and ground wires 70 and 72.

The illustrated embodiment relates to the use of four ground wires 66, 68, 70, and 72, with a pair of ground wires 66, 68, 70, and 72 being associated with each of bondwire arrays 62 and 64. However, it should be appreciated that the range of embodiments is not so limited. For example, an alternative embodiment may include only ground wires 66 and 70 interposed between bondwire arrays 62 and 64. Such a two ground wire configuration can reduce some inductive coupling when space savings is especially critical.

Figure 5:
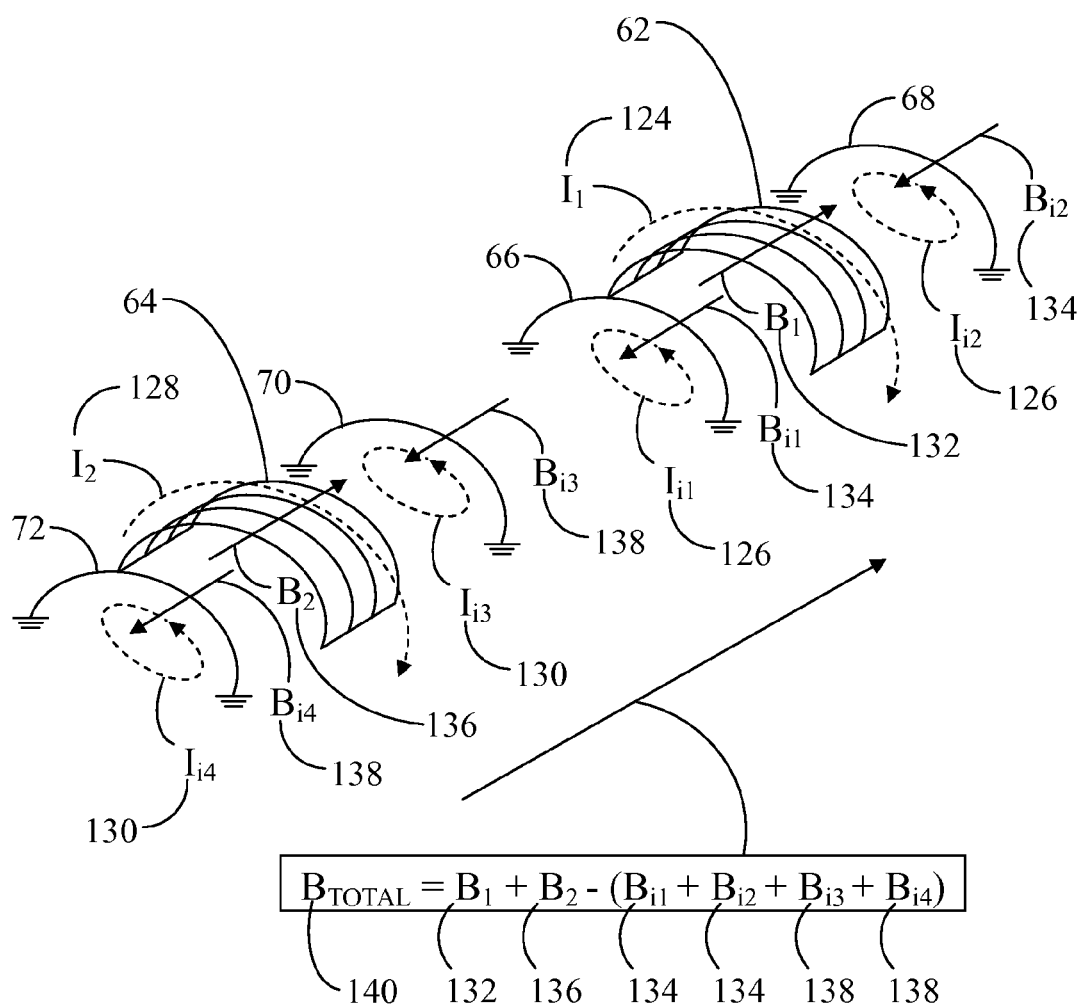
FIG. 5 shows a diagram of magnetic flux characteristics of adjacent bondwire arrays of the carrier and peaking amplifiers of the Doherty power amplifier semiconductor package.

FIG. 5 shows a diagram 122 of magnetic flux characteristics of adjacent bondwire arrays 62 and 64 of carrier and peaking amplifier circuits 22 and 24 (FIG. 1) of Doherty power amplifier semiconductor package 20 (FIG. 1). A signal current 124, labeled $I_1$, through bondwire array 62 induces return currents 126, labeled $I_{i1}$ and $I_{i2}$, in ground wires 66 and 68. Likewise, a signal current 128, labeled $I_2$, through bondwire array 64 induces return currents 130, labeled $I_{i3}$ and $I_{i4}$, in ground wires 70 and 72. Signal current 124, labeled $I_1$, generates a magnetic field measured as a magnetic flux density 132. However, the induced return currents 126, labeled $I_{i1}$ and $I_{i2}$, set up a magnetic flux density 134, labeled $B_{i1}$ and $B_{i2}$, that opposes magnetic flux density 132, labeled $B_1$, in bondwire array 62. In addition, signal current 128, labeled $I_2$, generates a magnetic field measured as a magnetic flux density 136. However, the induced return currents 130, labeled $I_{i3}$ and $I_{i4}$, set up a magnetic flux density 138, labeled $B_{i3}$ and $B_{i4}$, that opposes magnetic flux density 136, labeled $B_2$, in bondwire array 64.

The superposition of magnetic flux densities 132, 134, 136, and 138 results in an overall reduction of a total magnetic flux density 140, labeled $B_{TOTAL}$. In other words, magnetic flux densities 132 and 136 are additive, whereas the opposing magnetic flux densities 134 and 138 are subtractive from total magnetic flux density 140. It is this total magnetic flux density 140 that dominates inductive coupling between bondwire arrays 62 and 64. By reducing total magnetic flux density 140, a reduction in inductive coupling is achieved.

The reduction of inductive coupling enables the implementation of a high efficiency Doherty power amplifier implemented in a single, dual-path semiconductor package. The dual-path Doherty power amplifier semiconductor package can thus be utilized in various devices dependent upon semiconductor packages, where low weight and small volume are essential. Moreover, this approach lends itself to minimal cost and infrastructure since the grounded bond wires are of the same profile as those of the signal wires. As such, a wire bonding process simply entails the addition of two additional wires per bondwire array.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A semiconductor package comprising:
   a first circuit having a first electrical device, a second electrical device, and a first bondwire array of first wires interconnecting said first electrical device with said second electrical device;
   a second circuit adjacent to said first circuit, said second circuit having a third electrical device, a fourth electrical device, and a second bondwire array of second wires interconnecting said third electrical device with said fourth electrical device, said second bondwire array being proximate to said first bondwire array; and
   at least one ground wire located between said first and second bondwire arrays and arranged substantially aligned with one of said first bondwire array of said first wires and said second bondwire array of said second wires, said at least one ground wire being coupled to a ground region.

2. A semiconductor package as claimed in claim 1 wherein said one of said first bondwire array of said first wires and said second bondwire array of said second wires, and said at least one ground wire exhibit a substantially common profile.

3. A semiconductor package as claimed in claim 1 wherein:
   said first bondwire array includes a first inner wire of said first wires, said first inner wire being closer to said second bondwire array than remaining ones of said first wires;
   said second bondwire array includes a second inner wire of said second wires, said second inner wire being closer to said first bondwire array than remaining ones of said second wires; and
   said at least one ground wire includes a first ground wire positioned proximate said first inner wire and a second ground wire positioned proximate said second inner wire.

4. A semiconductor package as claimed in claim 3 wherein:
   each of said first wires of said first bondwire array and said first ground wire are attached to a first topside of said first electrical device; and
   each of said second wires of said second bondwire array and said second ground wire are attached to a third topside of said third electrical device.

5. A semiconductor package as claimed in claim 4 wherein:
   said each of said first wires of said first bondwire array and said first ground wire are further attached to a second topside of said second electrical device; and
   said each of said second wires of said second bondwire array and said second ground wire are further attached to a fourth topside of said fourth electrical device.

6. A semiconductor package as claimed in claim 5 wherein:
   a first ground interconnect is located on at least one of said first and second topsides of respective first and second electrical devices, said first ground wire being coupled to said first ground interconnect; and
   a second ground interconnect is located on at least one of said third and fourth topsides of respective third and fourth electrical devices, said second ground wire being coupled to said second ground interconnect, and said first and second ground interconnects being electrically coupled with said ground region.

7. A semiconductor package as claimed in claim 3 wherein:
   said first ground wire is spaced apart from said first inner wire by a distance; and
   said second ground wire is spaced apart from said second inner wire by substantially said distance.

8. A semiconductor package as claimed in claim 7 wherein said distance is between 50 and 500 microns.

9. A semiconductor package as claimed in claim 3 wherein:
   said first bondwire array includes a first outer wire of said first wires, said first outer wire being farther from said second bondwire array than remaining ones of said first wires;
   said second bondwire array includes a second outer wire of said second wires, said second outer wire being farther from said first bondwire array than remaining ones of said second wires; and
   said semiconductor package further comprises a third ground wire positioned proximate said first outer wire and a fourth ground wire positioned proximate said second outer wire, said third and fourth ground wires being coupled to said ground region.

10. A semiconductor package as claimed in claim 9 wherein:
    said first ground wire is spaced apart from said first inner wire by a distance;
    said second ground wire is spaced apart from said second inner wire by said distance;
    said third ground wire is spaced apart from said first outer wire by said distance; and
    said fourth ground wire is spaced apart from said second outer wire by said distance.

11. A semiconductor package as claimed in claim 9 wherein:
    each of said first wires of said first bondwire array, said first ground wire, and said third ground wire exhibit a first substantially common profile; and
    each of said second wires of said second bondwire array, said second ground wire, and said fourth ground wire exhibit a second substantially common profile.

12. A semiconductor package as claimed in claim 1 wherein said semiconductor package comprises a Doherty power amplifier, said first circuit is a carrier amplifier of said Doherty power amplifier, said second circuit is a peaking amplifier of said Doherty power amplifier, said first and third electrical devices are transistors, and said second and fourth electrical devices are capacitors.

13. A semiconductor package as claimed in claim 12 wherein said first and second circuits are mounted on a common carrier.

14. A Doherty power amplifier semiconductor package comprising:
    a carrier amplifier having a first transistor, a first capacitor, and a first bondwire array of first wires interconnecting said first transistor with said first capacitor;
    a peaking amplifier adjacent to carrier amplifier, said peaking amplifier having a second transistor, a second capacitor, and a second bondwire array of second wires interconnecting said second transistor with said second capacitor, said second bondwire array being proximate to said first bondwire array, said first bondwire array including a first inner wire of said first wires, said first inner wire being closer to said second bondwire array than remaining ones of said first wires, said second bondwire array including a second inner wire of said second wires, said second inner wire being closer to said first bondwire array than remaining ones of said second wires;
    a first ground wire positioned proximate said first inner wire and substantially aligned with said first inner wire; and
    a second ground wire positioned proximate said second inner wire and substantially aligned with said second inner wire, said first and second ground wires being located between said first and second bondwire arrays, said first and second ground wires being coupled to a ground region.

15. A Doherty power amplifier semiconductor package as claimed in claim 14 wherein:
    said first bondwire array includes a first outer wire of said first wires, said first outer wire being farther from said second bondwire array than remaining ones of said first wires;
    said second bondwire array includes a second outer wire of said second wires, said second outer wire being farther from said first bondwire array than remaining ones of said second wires; and
    said Doherty power amplifier semiconductor package further comprises a third ground wire positioned proximate said first outer wire and a fourth ground wire positioned proximate said second outer wire, said third and fourth ground wires being coupled to said ground region.

16. A Doherty power amplifier semiconductor package as claimed in claim 15 wherein:
    said first ground wire is spaced apart from said first inner wire by a distance;
    said second ground wire is spaced apart from said second inner wire by said distance;
    said third ground wire is spaced apart from said first outer wire by said distance; and
    said fourth ground wire is spaced apart from said second outer wire by said distance, said distance being between 50 and 500 microns.

17. A Doherty power amplifier semiconductor package as claimed in claim 15 wherein:
    each of said first wires of said first bondwire array, said first ground wire, and said third ground wire exhibit a first substantially common profile; and
    each of said second wires of said second bondwire array, said second ground wire, and said fourth ground wire exhibit a second substantially common profile.

18. A semiconductor package comprising:
    a first circuit having a first electrical device, a second electrical device, and a first bondwire array interconnecting said first electrical device with said second electrical device;
    a second circuit adjacent to said first circuit, said second circuit having a third electrical device, a fourth electrical device, and a second bondwire array interconnecting said third electrical device with said fourth electrical device, said second bondwire array being proximate to said first bondwire array with first wires of said first bondwire array being arranged substantially aligned with second wires of said second bondwire array, said first bondwire array including a first inner wire of said first wires, said first inner wire being closer to said second bondwire array than remaining ones of said first wires, said second bondwire array including a second inner wire of said second wires, said second inner wire being closer to said first bondwire array than remaining ones of said second wires;
    a first ground wire positioned proximate said first inner wire, each of said first wires of said first bondwire array and said first ground wire exhibiting a first substantially common profile; and
    a second ground wire positioned proximate said second inner wire, each of said second wires of said second bondwire array and said second ground wire exhibiting a second substantially common profile, said first and second ground wires being located between said first and second bondwire arrays, and said first and second ground wires being coupled to a ground region.

19. A semiconductor package as claimed in claim 18 wherein:
    said each of said first wires of said first bondwire array and said first ground wire are attached to a first topside of said first electrical device; and
    said each of said second wires of said second bondwire array and said second ground wire are attached to a third topside of said third electrical device.

20. A semiconductor package as claimed in claim 19 wherein:
    said each of said first wires of said first bondwire array and said first ground wire are further attached to a second topside of said second electrical device; and
    said each of said second wires of said second bondwire array and said second ground wire are further attached to a fourth topside of said fourth electrical device.

* * * * *